(12) United States Patent
Akiyama et al.

(10) Patent No.: US 10,868,123 B2
(45) Date of Patent: Dec. 15, 2020

(54) SIC-SOI DEVICE AND MANUFACTURING METHOD THEREOF

(71) Applicant: Mitsubishi Electric Corporation, Tokyo (JP)

(72) Inventors: Hajime Akiyama, Tokyo (JP); Manabu Yoshino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/441,371

(22) Filed: Jun. 14, 2019

(65) Prior Publication Data
US 2020/0027954 A1    Jan. 23, 2020

(30) Foreign Application Priority Data

Jul. 17, 2018  (JP) .................................. 2018-134022

(51) Int. Cl.
*H01L 29/15*  (2006.01)
*H01L 29/16*  (2006.01)
(Continued)

(52) U.S. Cl.
CPC ...... *H01L 29/1608* (2013.01); *H01L 21/7624* (2013.01); *H01L 29/0611* (2013.01); *H01L 29/0649* (2013.01); *H01L 29/66068* (2013.01); *H01L 29/7394* (2013.01); *H01L 29/782* (2013.01); *H01L 29/7824* (2013.01)

(58) Field of Classification Search
None
See application file for complete search history.

(56) References Cited

U.S. PATENT DOCUMENTS

| 10,014,408 | B1 * | 7/2018 | Lin ................... | H01L 29/66681 |
| 2015/0295026 | A1 * | 10/2015 | Chang ................ | H01L 29/0688 257/341 |
| 2018/0012980 | A1 * | 1/2018 | Gu ...................... | H01L 29/1037 |

FOREIGN PATENT DOCUMENTS

JP    H11-297815 A    10/1999

OTHER PUBLICATIONS

Power Semiconductor Device and Power IC Handbook, Institute of Electrical Engineers of Japan, 1996, p. 204 (Fig. 8.56), Japan.
(Continued)

*Primary Examiner* — Hung K Vu
(74) *Attorney, Agent, or Firm* — Studebaker & Brackett PC

(57) ABSTRACT

The object of the present invention is to increase the breakdown voltage without thickening an SOI layer in a wafer-bonded dielectric isolated structure. A device region of a SiC-SOI device includes: a first trench continuously or intermittently surrounding an $n^-$ type drift region and not penetrating a SiC substrate; an $n^+$ type side surface diffusion region formed on each side surface of the first trench; an $n^+$ type bottom diffusion region formed under the $n^-$ type drift region and in contact with the $n^+$ type side surface diffusion region; and a plurality of thin insulating films formed in proximity to a surface of the $n^-$ type drift region at regular spacings of 0.4 μm or less. A surrounding region includes a second trench formed to continuously surround the first trench and penetrating the SiC substrate, and an isolated insulating film region formed on each side surface of the second trench.

3 Claims, 13 Drawing Sheets

(51) Int. Cl.
*H01L 29/78* (2006.01)
*H01L 29/739* (2006.01)
*H01L 21/762* (2006.01)
*H01L 29/06* (2006.01)
*H01L 29/66* (2006.01)

(56) References Cited

OTHER PUBLICATIONS

Akira Yoshino, Formation Process of SOI (silicon-on-insulator) Structures Utilizing High Dose Oxygen Implantation Technology, The Surface Science Society of Japan, 1994, pp. 101-105, vol. 15, No. 2, Japan.
Hiroyuki Matsunami et al., Technology of Semiconductor SiC and Its Application, 2nd Edition, 2011, p. 352 (Fig. 8.3.8), Japan.

* cited by examiner

F I G. 1
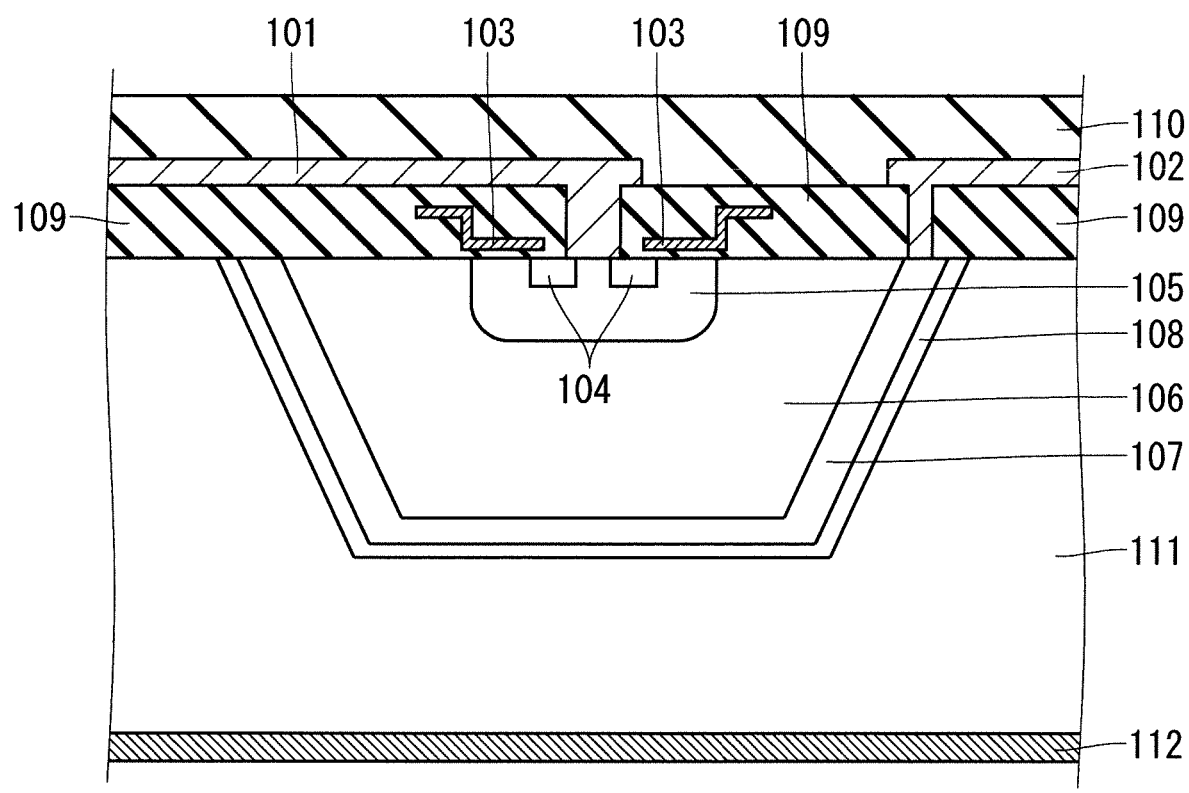

SIC-SOI DEVICE AND MANUFACTURING METHOD THEREOF

BACKGROUND OF THE INVENTION

Field of the Invention

This invention relates to a SiC-SOI device.

Description of the Background Art

The most typical structure of a Si dielectric isolated substrate structure is of an epitaxial passivated integration circuit (EPIC). In the EPIC, devices are formed in island regions individually separated by oxide films and made of a single crystal. Basically, electrodes are withdrawn from the surface side. The inside of the island regions is covered with an n+ region which blocks the influence of potential variations on the substrate side and which also functions as an n+ cathode region of a diode. A vertical dielectric isolated device formed inside the EPIC has been applied to power IC products for relatively small currents with the breakdown voltage ranging from 2 V to 350 V. Since the substrate is formed by depositing poly-Si, it tends to have a large warpage while being a wafer. Thus, the vertical dielectric isolated device has a critical factor of having difficulties in its application when the diameter of the wafer is increased to 6 inches or more.

Examples of the dielectric isolated structure supporting increase in the diameter of the wafer and increase in the breakdown voltage of an internal power device include a wafer-bonded structure (see, for example, Japanese Patent Application Laid-Open No. H11-297815). However, the wafer-bonded structure requires widening a V-shaped separation region due to thickening of a silicon on insulator (SOI) layer caused by increase in the breakdown voltage, and involves a new limiting factor of obstructing the advanced integration.

SUMMARY

The object is to increase the breakdown voltage without thickening the SOI layer in a wafer-bonded dielectric isolated structure.

A first SiC-SOI device according to the present invention includes a first substrate and a SiC substrate. The SiC substrate is bonded to the first substrate through an insulating film. A device region and a surrounding region are formed in the SiC substrate. The surrounding region surrounds the device region. The device region includes a drift region of a first conductivity type, a first trench, a first diffusion region, a second diffusion region of the first conductivity type, and a plurality of first thin insulating films. The first trench continuously or intermittently surrounds the drift region, and does not penetrate the SiC substrate. The first diffusion region is formed on each side surface of the first trench, and is higher in impurity concentration than the drift region. The second diffusion region is formed under the drift region, is in contact with the first diffusion region, and is higher in impurity concentration than the drift region. The plurality of first thin insulating films are formed parallel to and in proximity to a surface of the drift region at regular spacings of 0.4 μm or less. The surrounding region includes a second trench and an isolated insulating film region. The second trench is formed to continuously surround the first trench. The isolated insulating film region is formed on each side surface of the second trench.

Since the ON resistance is reduced by the first trench and the surrounding structure in the first SiC-SOI device according to the present invention, the conduction loss is suppressed. The second trench and the surrounding structure, that is, the isolated insulating film region can dielectrically isolate the device region. Even upon occurrence of the avalanche current in a formation region of the first or second thin insulating films, an advantage of suppressing the avalanche current multiplication will be produced. Thus, adjustment of the device structure to locally maximize the field intensity in the formation region of the first or second thin insulating films can increase the breakdown voltage value without thickening the SOI layer.

A second SiC-SOI device according to the present invention includes a first substrate and a SiC substrate. The SiC substrate is bonded to the first substrate through an insulating film. A device region and a surrounding region are formed in the SiC substrate. The surrounding region surrounds the device region. The device region includes a drift region of a first conductivity type, a first trench, a first diffusion region, a second diffusion region of the first conductivity type, a third diffusion region of a second conductivity type, a buried region of the second conductivity type, and a plurality of second thin insulating films. The first trench continuously or intermittently surrounds the drift region, and does not penetrate the SiC substrate. The first diffusion region is formed on each side surface of the first trench, and is higher in impurity concentration than the drift region. The second diffusion region is formed under the drift region, is in contact with the first diffusion region, and is higher in impurity concentration than the drift region. The third diffusion region is formed in a surface layer of the drift region. The buried region is formed deeper than the third diffusion region in the drift region. The second thin insulating films are formed parallel to a surface of the drift region at regular spacings of 0.4 μm or less and as deep as the buried region in the drift region.

Even upon occurrence of the avalanche current in a formation region of the second thin insulating films, an advantage of suppressing the avalanche current multiplication will be produced in the second SiC-SOI device according to the present invention. Thus, adjustment of the device structure to locally maximize the field intensity in the formation region of the second thin insulating films can increase the breakdown voltage value without thickening the SOI layer.

A method for manufacturing a first SiC-SOI device according to the present invention includes: (a) forming a plurality of first thin insulating films parallel to and in proximity to a surface of a drift region at regular spacings of 0.4 μm or less, the drift region being included in a SiC substrate of a first conductivity type; (b) bonding a rear surface of the SiC substrate of the first conductivity type to a Si substrate through an insulating layer; (c) forming a first trench to continuously or intermittently surround the drift region in the SiC substrate, the first trench not penetrating the SiC substrate and being formed from a surface of the SiC substrate; (d) forming a first diffusion region of the first conductivity type on each side surface of the first trench, the first diffusion region being higher in impurity concentration than the drift region; (e) forming a second trench to surround the first trench, the second trench penetrating the SiC substrate; and (f) forming an isolated insulating film region on each side surface of the second trench.

Since the ON resistance is reduced by the first trench and the surrounding structure in a SiC-SOI device manufactured by the method for manufacturing the first SiC-SOI device according to the present invention, the conduction loss is suppressed. The second trench and the surrounding structure, that is, the isolated insulating film region can dielectrically isolate the device region. Even upon occurrence of the avalanche current in a formation region of the first or second thin insulating films, an advantage of suppressing the avalanche current multiplication will be produced. Thus, adjustment of the device structure to locally maximize the field intensity in the formation region of the first or second thin insulating films can increase the breakdown voltage value without thickening the SOI layer.

A method for manufacturing a second SiC-SOI device according to the present invention includes: (a) forming a third diffusion region of a second conductivity type in a surface layer of a drift region included in a SiC substrate of a first conductivity type; (b) forming a buried region deeper than the third diffusion region in the drift region, the buried region being of the second conductivity type; (c) forming a plurality of second thin insulating films parallel to a surface of the drift region at regular spacings of 0.4 µm or less and as deep as the buried region in the drift region; (d) bonding a rear surface of the SiC substrate of the first conductivity type to a Si substrate through an insulating layer; (e) forming a first trench to continuously or intermittently surround the drift region in the SiC substrate, the first trench not penetrating the SiC substrate and being formed from a surface of the SiC substrate; (f) forming a first diffusion region of the first conductivity type on each side surface of the first trench, the first diffusion region being higher in impurity concentration than the drift region; (g) forming a second trench to surround the first trench, the second trench penetrating the SiC substrate; and (h) forming an isolated insulating film region on each side surface of the second trench.

Even upon occurrence of the avalanche current in a formation region of the second thin insulating films, an advantage of suppressing the avalanche current multiplication will be produced in a SiC-SOI device manufactured by the method for manufacturing the second SiC-SOI device according to the present invention. Thus, adjustment of the device structure to locally maximize the field intensity in the formation region of the second thin insulating films can increase the breakdown voltage value without thickening the SOI layer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of a vertical Si-MOS formed in an EPIC;

DESCRIPTION OF THE PREFERRED EMBODIMENTS

Figure 2:
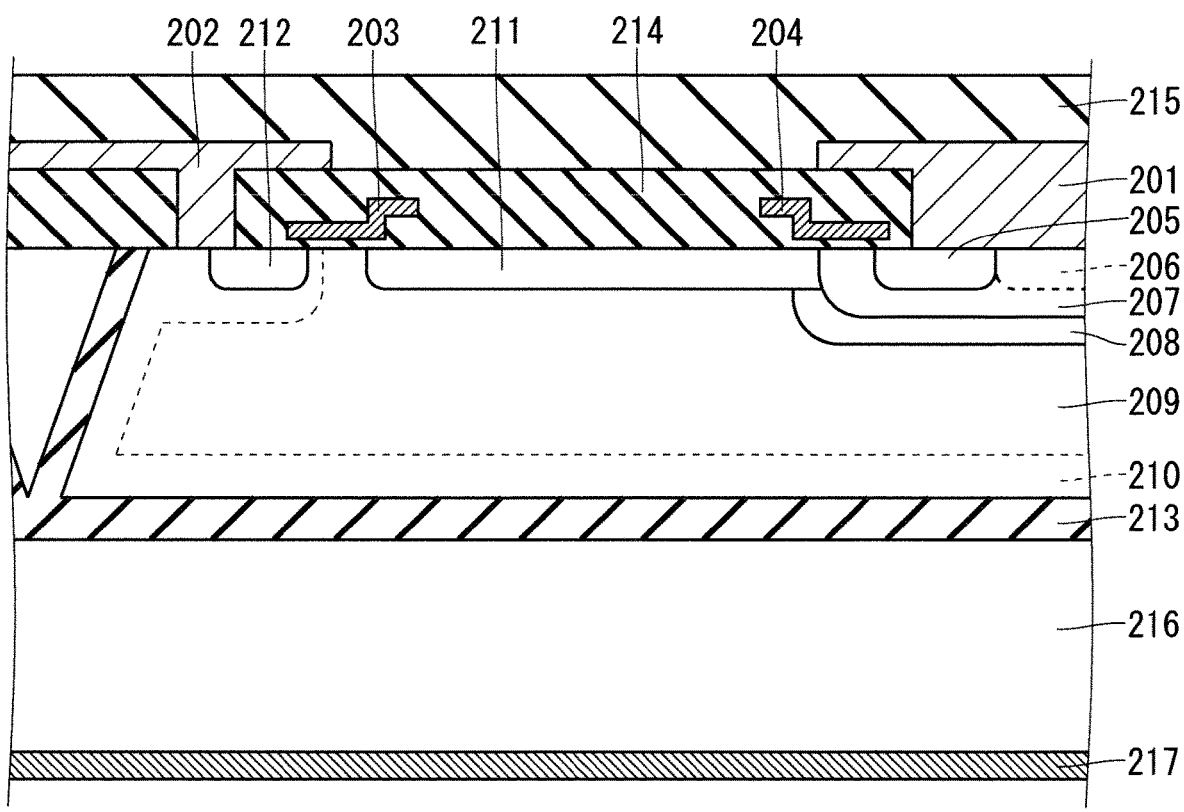
FIG. 2 is a cross-sectional view of a vertical Si-IGBT formed in a wafer-bonded dielectric isolated structure.

Embodiments will be hereinafter described with reference to the attached drawings. Since the drawings are schematically illustrated, the mutual relationships in size and position between images in the different drawings are not necessarily accurate but may be appropriately changed. In the following description, the same reference numerals are assigned to the same constituent elements, and their names and functions are the same. Thus, the detailed description thereof may be omitted.

Although the description below sometimes uses the words representing particular positions and directions including "above", "under", "side", "bottom", "front", and "rear", these words are used for convenience to facilitate the understanding of the details of Embodiments, and do not limit the directions for actual use.

The conductivity type of semiconductors will be described assuming that the first conductivity type is n-type and the second conductivity type is p-type. These may be reversed to handle the first conductivity type as p-type and the second conductivity type as n-type. $n^+$ type means having an impurity concentration higher than that of n-type, and $n^-$ type means having an impurity concentration lower than that of n-type. Similarly, $p^+$ type means having an impurity concentration higher than that of p-type, and $p^-$ type means having an impurity concentration lower than that of p-type.

A. Premise Technique

The most typical structure of a Si dielectric isolated substrate structure is of the EPIC. Devices are formed in island regions individually separated by oxide films and made of a single crystal. Basically, electrodes are withdrawn from the surface side. The inside of the island regions is covered with an $n^+$ region which blocks the influence of potential variations on the substrate side and which also functions as an $n^+$ cathode region of a diode.

FIG. 1 is a cross-sectional view of a vertical Si-MOS formed in the EPIC. The device body includes a source extraction electrode 101, a drain extraction electrode 102, a gate electrode 103, an $n^+$ type source region 104, a $p^-$ type well region 105, an $n^-$ type drift region 106, and an $n^+$ type drain region 107, each of which is isolated by a dielectric isolated layer 108, an interlayer insulation film 109, and a protective film 110. A substrate 111 is formed by depositing poly-Si. Normally, a rear electrode 112 is set to a ground potential. The vertical dielectric isolated device formed inside the EPIC has been applied to power IC products for relatively small currents with the breakdown voltage ranging from 2 V to 350 V. Since the substrate 111 is formed by depositing poly-Si, it tends to have a large warpage while being a wafer. Thus, the vertical dielectric isolated device has a critical factor of having difficulties in its application when the diameter of the wafer is increased to 6 inches or more.

The wafer-bonded dielectric isolated structure has been proposed as a structure for supporting increase in the diameter of the wafer and increase in the breakdown voltage of an internal power device. FIG. 2 is a cross-sectional view of a vertical Si-IGBT formed in the wafer-bonded dielectric isolated structure. The device body includes an emitter extraction electrode 201, a collector extraction electrode 202, a first gate electrode 203, a second gate electrode 204, an n+ type emitter region 205, a p+ type emitter region 206, a p− type well region 207, an n− type well region 208, a p− type drift region 209, a p+ type collector region 210, an n+ type drift region 211, and an n+ type collector region 212, each of which is isolated by a dielectric isolated layer 213, an interlayer insulation film 214, and a protective film 215. The substrate 216 is made of a single crystal Si, and integrated with the device region using the dielectric isolated layer 213 as a junction surface. Normally, a rear electrode 217 is set to a ground potential as the rear electrode 112 in FIG. 1. Since no electric field is generated in the insulating film of the dielectric isolated layer 213 with application of the breakdown voltage, there is an advantage of eliminating the need for thickening an SOI layer due to increase in the breakdown voltage in the device. Thus, a problem of increase in the warpage due to increase in the diameter of the wafer will be solved. However, a V-shaped separation region has to be widened due to thickening of the SOI layer (DSOI) caused by increase in the breakdown voltage, which creates a new problem of decrease in the integration degree due to increase in the breakdown voltage.

B. Embodiment 1

B-1. Structure

Figure 3:
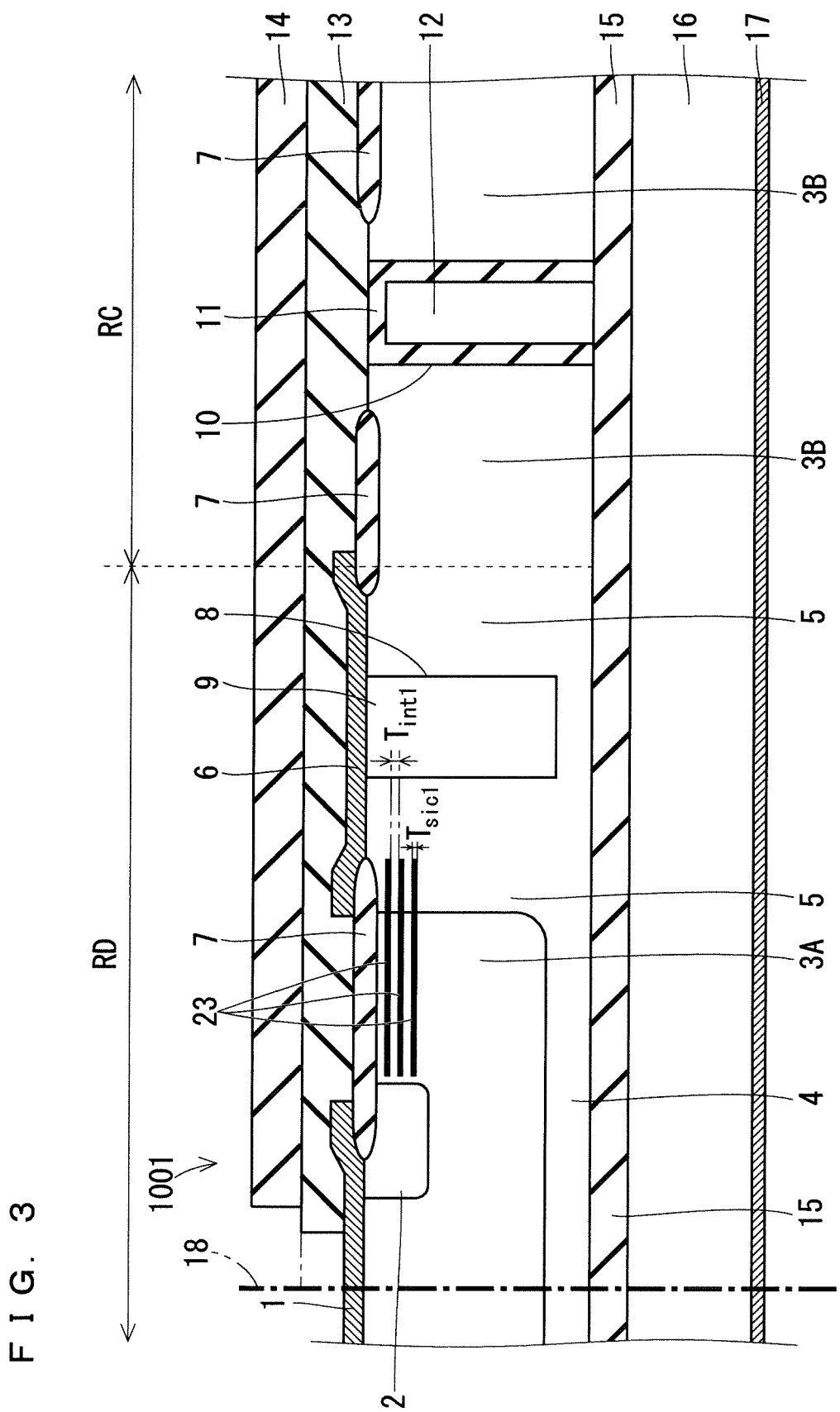
FIG. 3 is a cross-sectional view of a SiC-SOI device according to Embodiment 1.

FIG. 3 is a cross-sectional view of a SiC-SOI device 1001 according to Embodiment 1. FIG. 3 illustrates a part of the cross-sectional view of the SiC-SOI device 1001. The SiC-SOI device 1001 actually has a symmetric structure with respect to a central axis 18.

The SiC-SOI device 1001 includes an anode electrode 1, a p-type diffusion region 2, an n− type drift region 3A, an SOI n− type region 3B, an n+ type bottom diffusion region 4, an n+ type side surface diffusion region 5, a cathode electrode 6, a field insulating film 7, a first trench 8, an n+ type Si buried region 9, a second trench 10, an isolated insulating film region 11, a Si buried region 12, an interlayer insulation film 13, a protective film 14, a buried insulating film 15, a dielectric isolated substrate 16, a rear electrode 17, and thin insulating films 23.

The SiC-SOI device 1001 has a wafer-bonded structure of bonding, to the dielectric isolated substrate 16 through the buried insulating film 15, a SiC substrate in which, for example, the n− type drift region 3A is formed. The SiC substrate above the dielectric isolated substrate 16 is an SOI layer. The dielectric isolated substrate 16 will also be referred to as a first substrate. The rear electrode 17 is formed on a lower surface of the dielectric isolated substrate 16.

The SiC substrate has a device region RD in which a Schottky barrier diode (SBD) is formed, and a surrounding region RC surrounding the device region RD. Although the SBD is exemplified as a device included in the SiC-SOI device 1001, the SiC-SOI device 1001 may additionally include a switching element such as a MOSFET or an IGBT. In the device region RD, the n− type drift region 3A is formed in a surface layer of the SiC substrate, and the p-type diffusion region 2 is formed in a surface layer of the n− type drift region 3A. The n+ type bottom diffusion region 4 is formed under the n type drift region 3A. In the device region RD, the n+ type side surface diffusion region 5 that is in contact with the n+ type bottom diffusion region 4 is formed around the outer periphery of the n− type drift region 3A. In a central portion of the n+ type side surface diffusion region 5, the first trench 8 is formed to continuously or intermittently surround the n− type drift region 3A. The first trench 8 does not penetrate the SiC substrate. Thus, the n+ type side surface diffusion region 5 remains under the first trench 8. The n+ type Si buried region 9 is formed inside the first trench 8. The n+ type bottom diffusion region 4, the n+ type side surface diffusion region 5, and the n+ type Si buried region 9 are coupled to form a cathode region.

The anode electrode 1 is formed across the n− type drift region 3A and the p-type diffusion region 2. The cathode electrode 6 is formed across the n+ type side surface diffusion region 5 and the n+ type Si buried region 9. The field insulating film 7 caps the upper surface of the n− type drift region 3A between the anode electrode 1 and the cathode electrode 6. The field insulating film 7 is, for example, an oxide film.

A plurality of the thin insulating films 23 are formed parallel to and in proximity to the surface of the n− type drift region 3A. The thin insulating films 23 will also be referred to as first thin insulating films. The thickness $T_{sic1}$ of the thin insulating films 23 is defined as a predetermined value, and a spacing $T_{int1}$ between the adjacent thin insulating films 23 is less than or equal to 0.4 μm.

The reason why $T_{int1}$ is set less than or equal to 0.4 μm will be described hereinafter. According to "POWER SEMICONDUCTOR DEVICE AND POWER IC HANDBOOK", p. 204 (FIG. 8.56), Institute of Electrical Engineers of Japan (1996), it is known that a breakdown voltage changes according to change in the thickness of an SOI layer even while the thickness of buried oxide films, that is, the thin insulating films 23 is fixed. Change in the breakdown voltage has a certain tendency. In other words, assuming that the horizontal axis represents the thickness of the SOI layer and the vertical axis represents the breakdown voltage, the breakdown voltage has a local minimum value with a thickness of the SOI layer, that is, a pattern projected downward is observed. The breakdown voltage increases by thinning the SOI layer more than that when the breakdown voltage has the local minimum value. This is because the avalanche current caused by the avalanche breakdown cannot be amplified due to the thinness of the SOI layer, which effectively produces the effect of increasing the breakdown voltage. Although the SOI layer when the breakdown voltage has the local minimum value is slightly thinned due to thinning of the buried oxide films, the thickness converges to a value of approximately a little more than 1 μm. In other words, when the thickness of the SOI layer is a little more than 1 μm or less irrespective of the thickness of the buried oxide films, it is expected that the avalanche field intensity will be effectively improved by reducing the avalanche current. This is the view relying on the document describing the Si-SOI. Although the SiC-SOI differs from the Si-SOI in scale of the vertical axis due to the differences in the dielectric constant and the avalanche critical field intensity and thus exhibits increase in the breakdown voltage overall, the SiC-SOI and the Si-SOI have the same tendency in overall change in the breakdown voltage. Thus, the view is also appropriate to the SiC-SOI.

Next, the structure of the surrounding region RC will be described. The n− type region 3B is formed in the surrounding region RC. The second trench 10 penetrating the SiC substrate is formed in the n⁻ type region 3B. In other words, the second trench 10 penetrates the n⁻ type region 3B to reach the buried insulating film 15. The Si buried region 12 in which non-doped Si is buried is formed inside the second trench 10. The isolated insulating film region 11 is formed on the side surface and the top surface of the Si buried region 12. The isolated insulating film region 11 isolates the SiC-SOI device 1001 into the outer periphery and the inner periphery of the second trench 10. The field insulating film 7 also caps the upper surface of the n⁻ type region 3B, similarly as the n⁻ type drift region 3A. The interlayer insulation film 13 is formed on the anode electrode 1, the field insulating film 7, the cathode electrode 6, and the n⁻ type region 3B. The protective film 14 is formed on the interlayer insulation film 13. Thus, the device region RD of the SiC-SOI device 1001 is isolated on the surface side by the interlayer insulation film 13 and the protective film 14, on the rear surface side by the buried insulating film 15, and on the side surface side by the isolated insulating film region 11.

The dielectric isolated substrate 16 and the rear electrode 17 that mechanically support the device region RD and the surrounding region RC have the wafer-bonded dielectric isolated structure according to the conventional technology.

B-2. Operations

Figure 4:
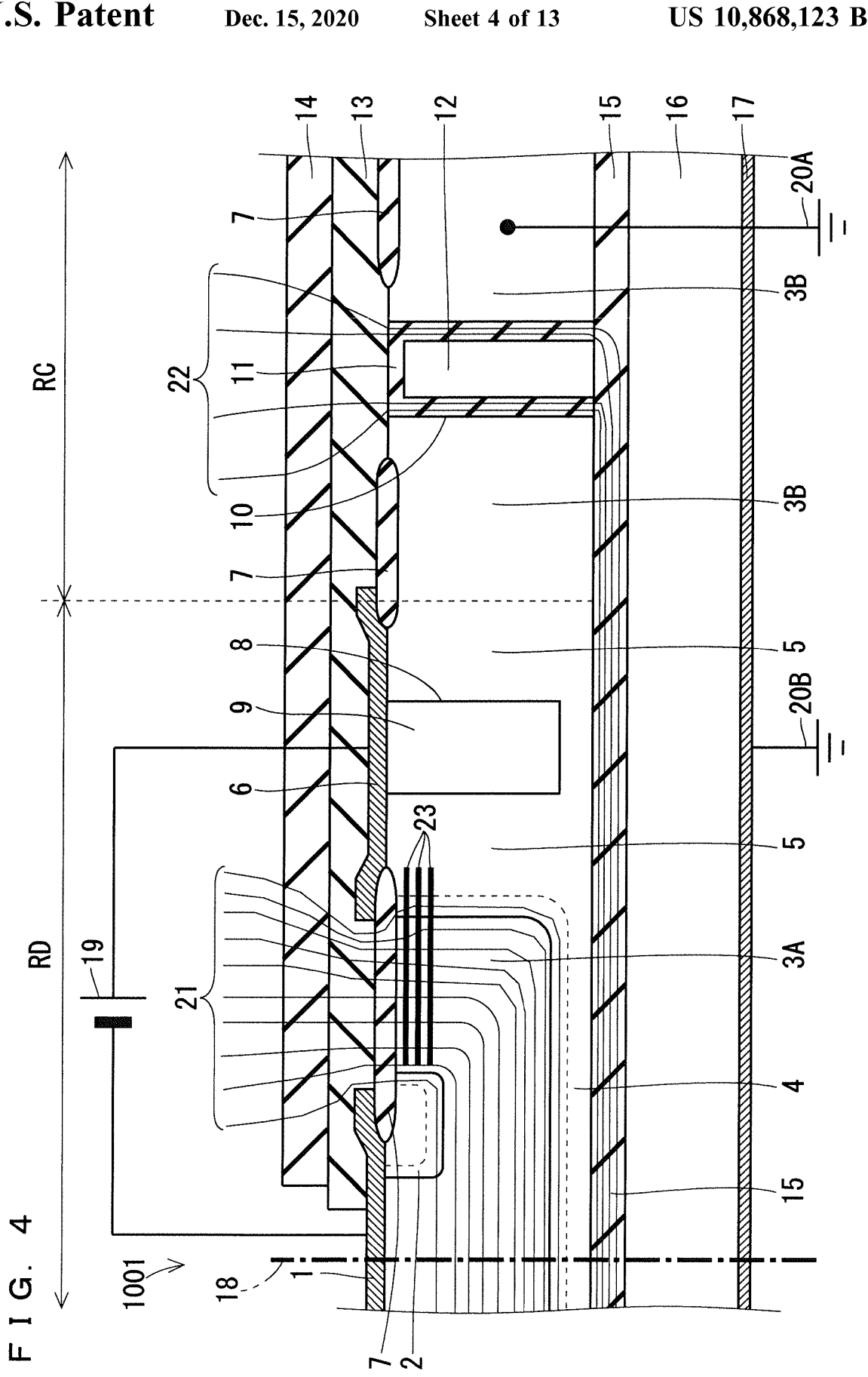
FIG. 4 is a cross-sectional view of the SiC-SOI device according to Embodiment 1 with application of a reverse bias voltage.

FIG. 4 is a cross-sectional view of the electric potential of the SiC-SOI device 1001 that is reverse-biased. A reverse bias power supply 19 is connected between the cathode electrode 6 and the anode electrode 1. The n⁻ type region 3B is connected to a grounding terminal 20A, and the rear electrode 17 is connected to a grounding terminal 20B. In a p-n junction portion between the p-type diffusion region 2 and the n⁻ type drift region 3A, the reverse bias power supply 19 extends a depletion layer to generate an electric potential distribution 21. When the ground potential is short-circuited with the cathode electrode 6, or when the cathode electrode 6 and the anode electrode 1 both have a potential difference with the ground potential, an electric potential distribution 22 is generated in an SOI dielectric isolated region, that is, the buried insulating film 15 and the isolated insulating film region 11.

Figure 5:
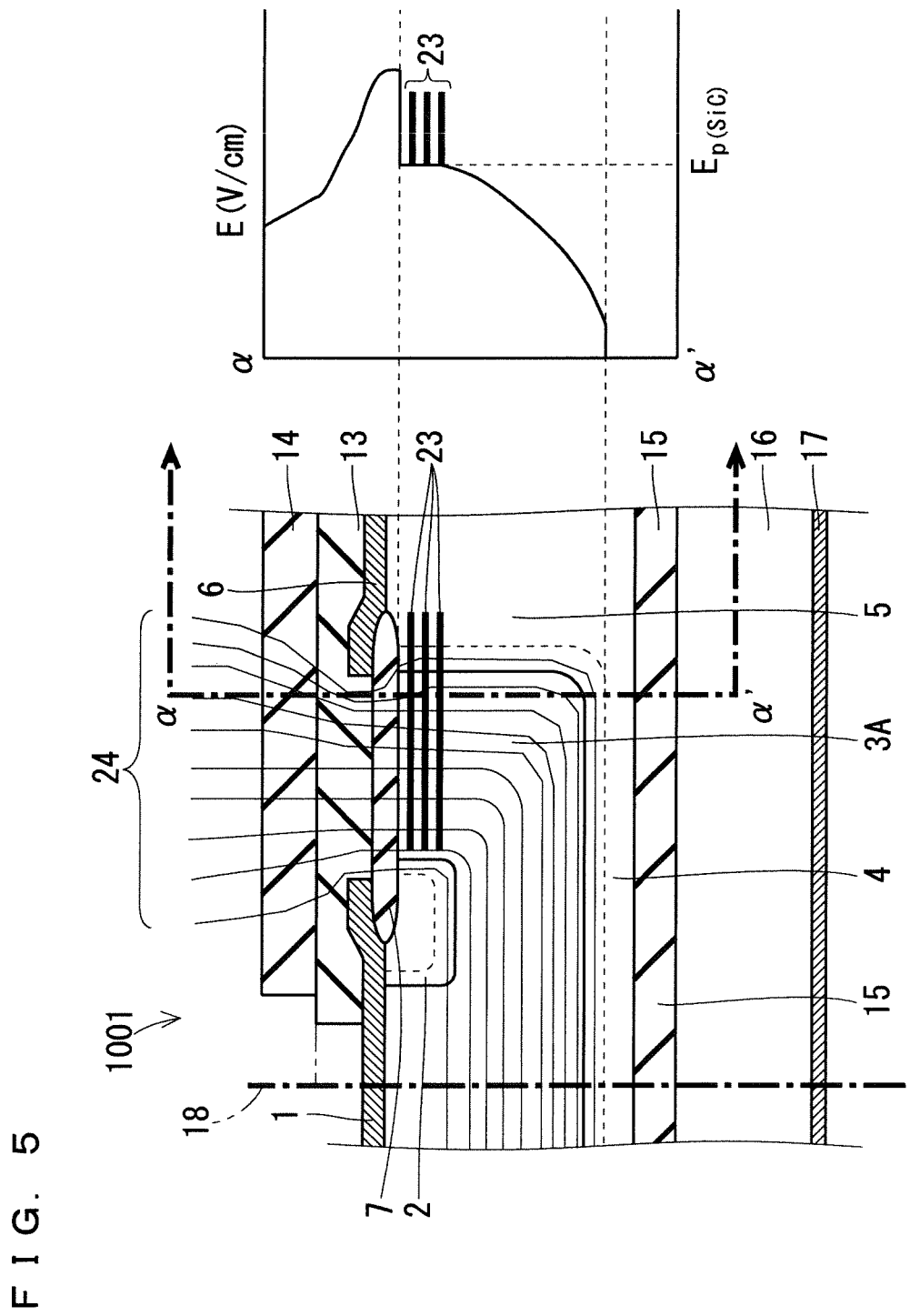
FIG. 5 is a cross-sectional view of the SiC-SOI device according to Embodiment 1 in a device region with application of a reverse bias voltage.

FIG. 5 illustrates an electric potential distribution and a field intensity distribution when the device region RD of the SiC-SOI device 1001 is reverse-biased. The left image in FIG. 5 illustrates an electric potential distribution 24 in the depletion layer of the p-n junction portion between the p-type diffusion region 2 and the n⁻ type drift region 3A. The right image in FIG. 5 illustrates one dimensional profile of the electric field intensity E taken along a section α-α' in the left image.

This image shows that the field intensity $E_{p(SiC)}$ in a formation region of the thin insulating films 23 is high in the n⁻ type drift region 3A. The effective breakdown voltage will be improved, because the avalanche current multiplication is suppressed in the formation region of the thin insulating films 23 even when the field intensity $E_{p(SiC)}$ reaches the avalanche critical field intensity in the formation region of the thin insulating films 23 along with increase in the applied bias voltage. However, limitation in a manufacturing method does not allow the thin insulating films 23 to be manufactured at regular spacings of a little more than 1 μm or less without restraint. With application of the oxygen (O)-ion-implanted process to be described as the method for manufacturing the thin insulating films 23, an SOI layer 0.08 μm thick is formed when the acceleration energy is 80 keV, and an SOI layer 0.18 μm thick is formed when the acceleration energy is 180 keV as described in "Formation Process of SOI (silicon-on-insulator) Structures Utilizing High Dose Oxygen Implantation Technology", Akira YOSHINO, The Surface Science Society of Japan, Vol. 15, No. 2, pp. 101-105, 1994. The epitaxial layer formed after irradiation of oxygen ions has a thickness of 0.35 μm. Thus, it is appropriate to define the spacing $T_{int1}$ between the thin insulating films 23 to be smaller than or equal to 0.4 μm as an actually manufacturable range.

B-3. Manufacturing Method

Figure 6:
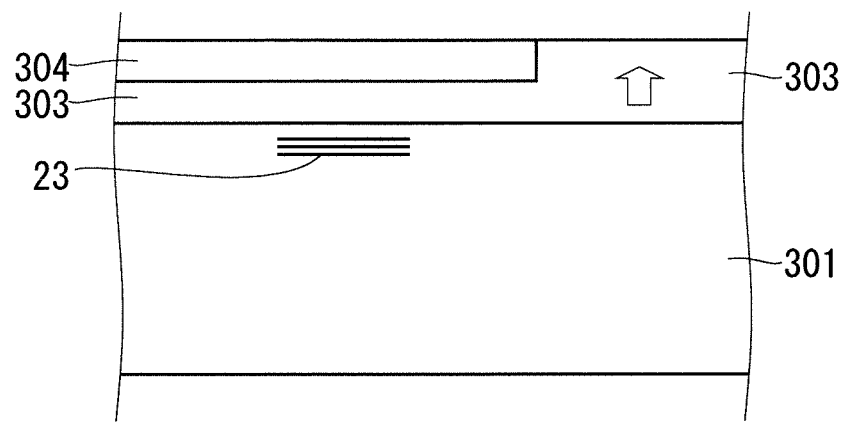
FIG. 6 to 11 are cross-sectional views illustrating manufacturing processes of the SiC-SOI device according to Embodiment 1.

FIGS. 6 to 11 are cross-sectional views illustrating manufacturing processes of the SiC-SOI device 1001. The manufacturing processes of the SiC-SOI device 1001 will be described with reference to FIGS. 6 to 11. A mask pattern is formed on a principal surface (will be hereinafter referred to as a "surface") of an n⁻ type SiC substrate 301 by photolithography. Then, oxygen (O) ions are implanted using the mask pattern to form a plurality of the thin insulating films 23. The plurality of thin insulating films 23 are formed by a method, for example, controlling accelerated ions or alternating between irradiation of ions and epitaxial growth. Next, a SiC epitaxial layer 303 to be an active layer of the SBD is grown on the surface of the SiC substrate 301. Then, an n+ type diffusion region 304 is formed on a part of the surface layer of the SiC epitaxial layer 303. Consequently, the structure illustrated in FIG. 6 is formed.

Figure 7:
Figure 8:
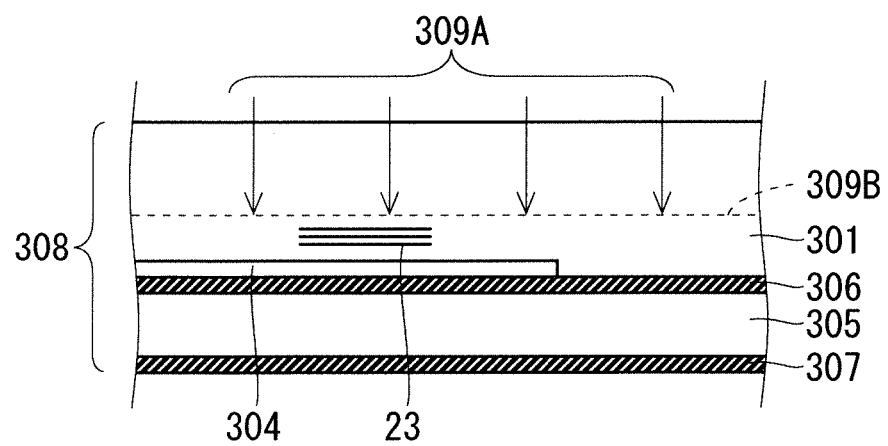

Next, as illustrated in FIG. 7, a $SiO_2$ layer 306 and a $SiO_2$ layer 307 are formed on the principal surface and another principal surface of a Si substrate 305, respectively. The Si substrate 305 obtained through the processes is bonded to another principal surface (will be hereinafter referred to as a "rear surface") of the SiC substrate 301 as illustrated in FIG. 8 to integrate the Si substrate 305 with the SiC substrate 301 by adding a bond-strengthening anneal process. Here, the Si substrate 305 is bonded to the SiC substrate 301 through the $SiO_2$ layer 306. This integrated structure will be referred to as an SOI bonded substrate 308. In FIG. 8 and subsequent figures, the SiC epitaxial layer 303 is not distinguished from the SiC substrate 301 but illustrated as the SiC substrate 301.

Next, hydrogen (H) ions are irradiated from the surface of the SiC substrate 301 as indicated by arrows 309A in FIG. 8. Here, hydrogen-ion range positions 309B are controlled to be located several μms before the thin insulating films 23. After irradiation of hydrogen ions, the surface of the SiC substrate 301 is peeled along the range positions 309B and then polished to prepare the SOI bonded substrate 308 that support the following processes.

Figure 9:
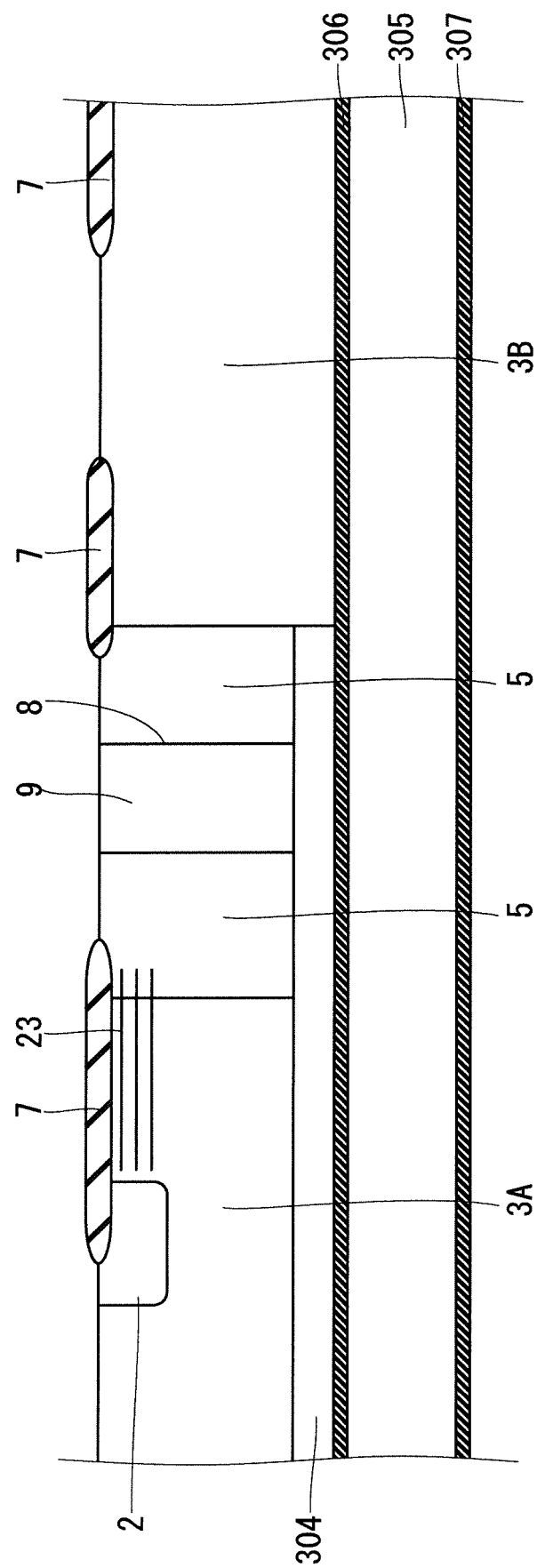

Next, the p-type diffusion region 2 and the field insulating film 7 are sequentially formed in the SOI bonded substrate 308. Then, the first trench 8 is formed around the outer periphery of the thin insulating films 23 to reach the n⁺ type diffusion region 304. Next, n⁺ type Si is buried in the first trench 8 to form the n⁺ type Si buried region 9. Then, the n⁺ type side surface diffusion region 5 is formed around each of the inner periphery and the outer periphery of the first trench 8 through annealing. Here, an n⁻ type region formed around the inner periphery of the n⁺ type side surface diffusion region 5 is the n⁻ type drift region 3A, and an SOI layer formed around the outer periphery of the n⁺ type side surface diffusion region 5 is the n⁻ type region 3B. Consequently, the structure illustrated in FIG. 9 is formed.

Next, the second trench 10 is formed around the outer periphery of the first trench 8 to reach the $SiO_2$ layer 306.

Figure 10:
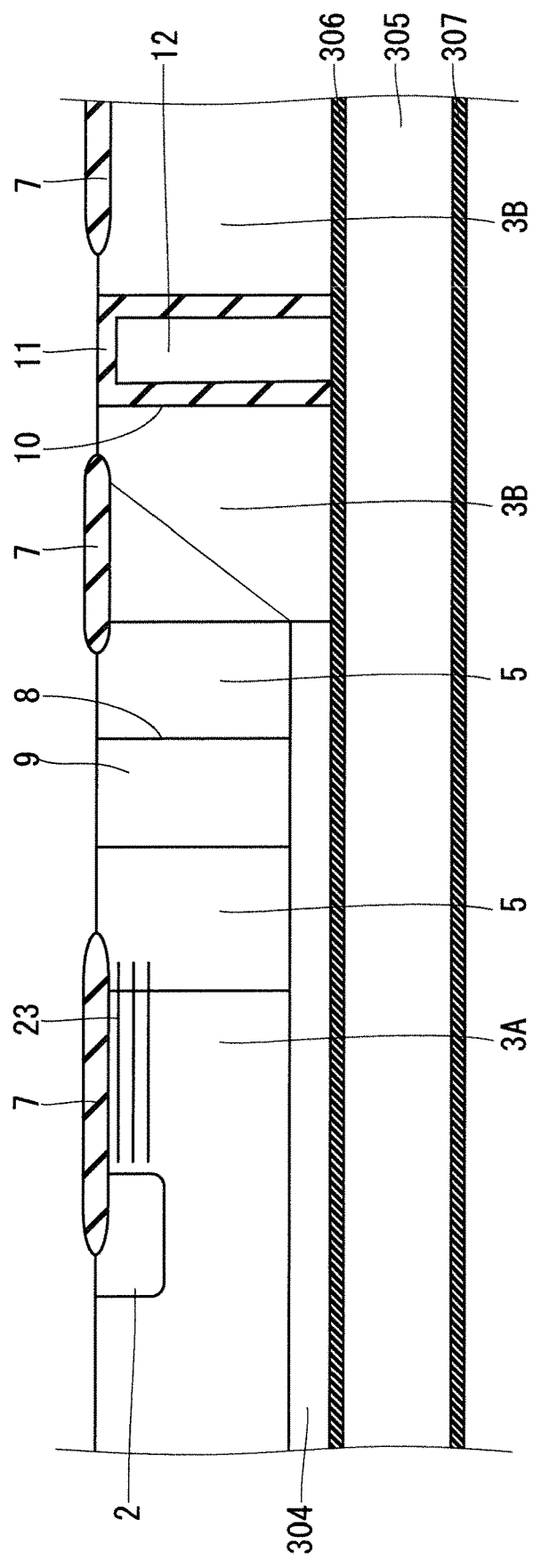
Figure 11:
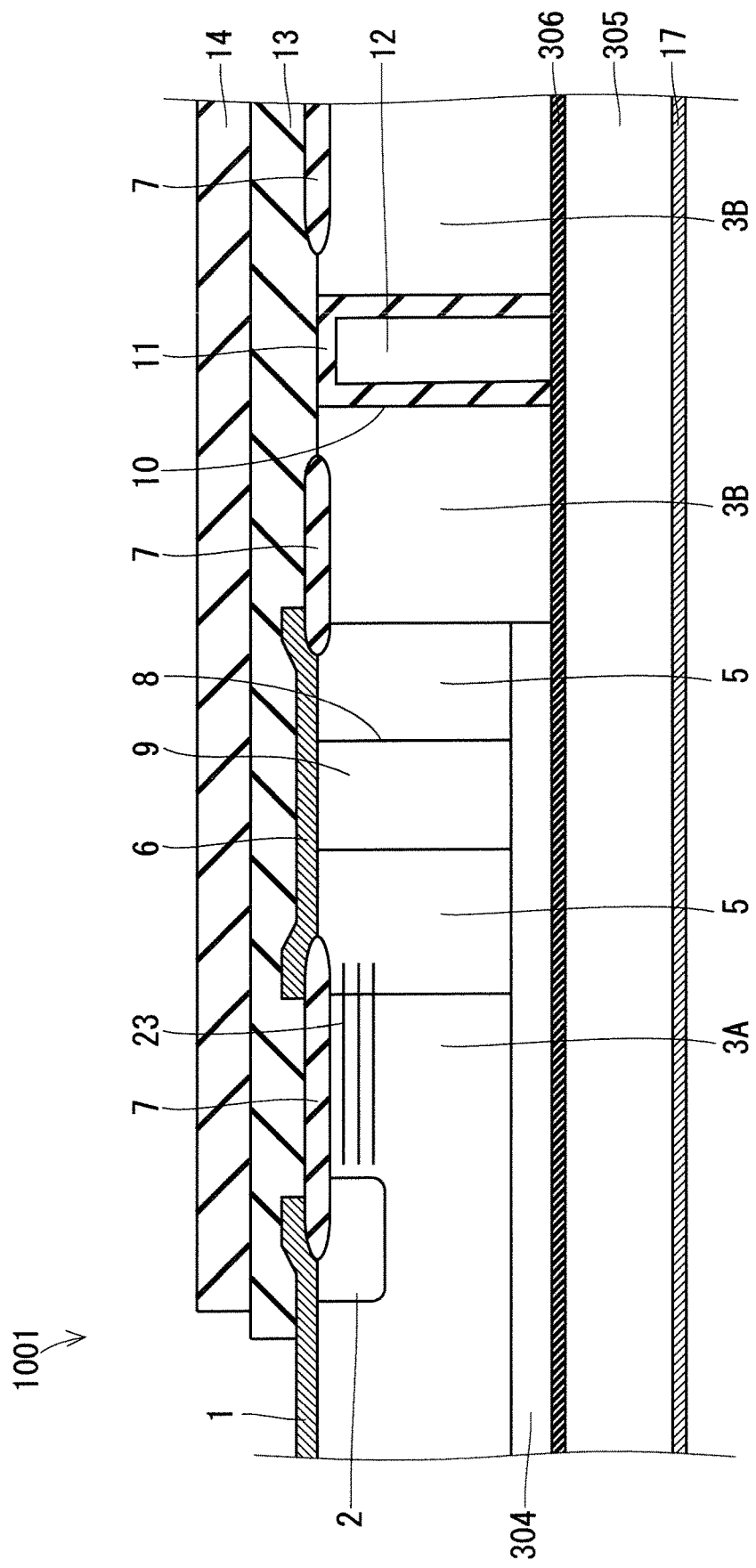

Then, the sidewall of the second trench 10 is oxidized to form the isolated insulating film region 11. Furthermore, poly-Si is buried in the second trench 10 to form the Si buried region 12. The upper surface of the Si buried region 12 is oxidized to complete the isolated insulating film region 11. Then, the field insulating film 7 is formed on the surface of the n⁻ type region 3B. Consequently, the structure illustrated in FIG. 10 is formed.

Next, the anode electrode 1, the cathode electrode 6, the interlayer insulation film 13, and the protective film 14 are sequentially formed. Then, the SiO₂ layer 307 is removed, and the rear electrode 17 is formed on the removed surface to obtain the SiC-SOI device 1001 illustrated in FIG. 11. The Si substrate 305 corresponds to the dielectric isolated substrate 16, and the SiO₂ layer 306 corresponds to the buried insulating film 15.

B-4. Advantages

The SiC-SOI device 1001 according to Embodiment 1 includes the dielectric isolated substrate 16 that is a first substrate, and the SiC substrate bonded to the dielectric isolated substrate 16 through the buried insulating film 15, the device region RD and the surrounding region RC surrounding the device region RD are formed in the SiC substrate, and the device region RD includes: the n⁻ type drift region 3A that is a drift region of the first conductivity type; the first trench 8 that continuously or intermittently surrounds the n⁻ type drift region 3A and that does not penetrate the SiC substrate; the n⁺ type side surface diffusion region 5 that is formed on each side surface of the first trench 8 and that is a first diffusion region of the first conductivity type; the n⁺ type bottom diffusion region 4 that is formed under the n⁻ type drift region 3A, is in contact with the n⁺ type side surface diffusion region 5, and is a second diffusion region of the first conductivity type; and a plurality of the thin insulating films 23 formed parallel to and in proximity to the surface of the n⁻ type drift region 3A at regular spacings of 0.4 µm or less. Then, the surrounding region RC includes the second trench 10 that is formed to continuously surround the first trench 8 and that penetrates the SiC substrate, and the isolated insulating film region 11 formed on each side surface of the second trench 10.

Since the ON resistance is reduced by the first trench 8 and the surrounding structure, that is, the n⁺ type side surface diffusion region 5 and the n⁺ type bottom diffusion region 4 in the SiC-SOI device 1001, the conduction loss is suppressed. The second trench 10 and the surrounding structure, that is, the isolated insulating film region 11 dielectrically isolates the device region RD. This can integrate high-side devices and low-side devices in a bridge circuit into the same substrate, that is, integrate inverter circuits into one chip to produce an advantage of improving the controllability. Even upon occurrence of the avalanche current in a formation region of the thin insulating films 23, an advantage of suppressing the avalanche current multiplication will be produced. Thus, adjustment of the device structure to locally maximize the field intensity in the formation region of the thin insulating films 23 can increase the breakdown voltage value without thickening the SOI layer.

C. Embodiment 2

C-1. Structure

Figure 12:
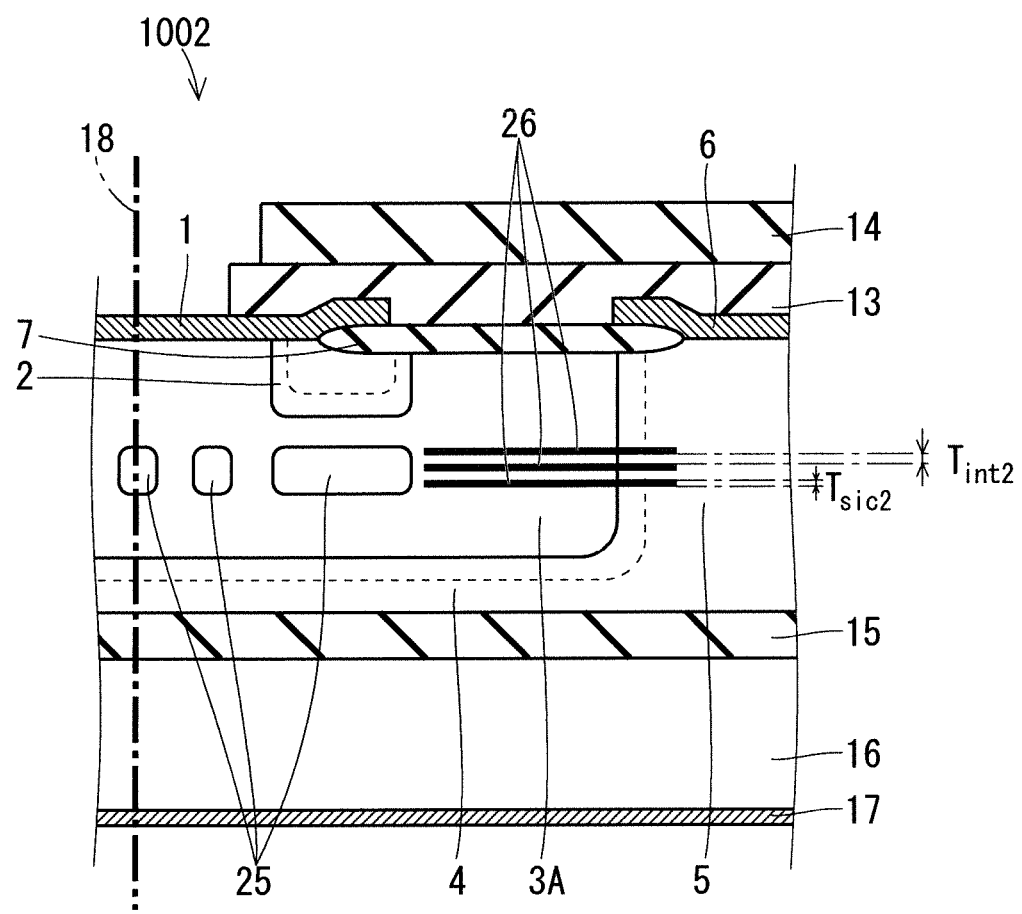
FIG. 12 is a cross-sectional view of a SiC-SOI device according to Embodiment 2.

FIG. 12 is a cross-sectional view of a device region of a SiC-SOI device 1002 according to Embodiment 2. The device region of the SiC-SOI device 1002 has a floating junction SBD (FJ-SBD) structure in which p-type buried regions 25 are formed in the n⁻ type drift region 3A, The FJ-SBD structure is described by, for example, "Technology of Semiconductor SiC and Its Application, the second edition", Hiroyuki MATSUNAMI, et al., p. 352, FIG. 8.3.8 (2011).

A plurality of thin insulating films 26 are formed parallel to the surface of the n⁻ type drift region 3A, in a region as deep as and adjacent to the p-type buried regions 25 in the n⁻ type drift region 3A. The structure of the SiC-SOI device 1002 except for the p-type buried regions 25 and the thin insulating films 26 is the same as that excluding the thin insulating films 23 from the SiC-SOI device 1001 according to Embodiment 1. The thin insulating films 26 will also be referred to as second thin insulating films. The thickness $T_{sic_2}$ of the thin insulating films 26 is defined as a predetermined value, and a spacing $T_{int2}$ between the adjacent thin insulating films 26 is less than or equal to 0.4 µm.

C-2. Operations

Figure 13:
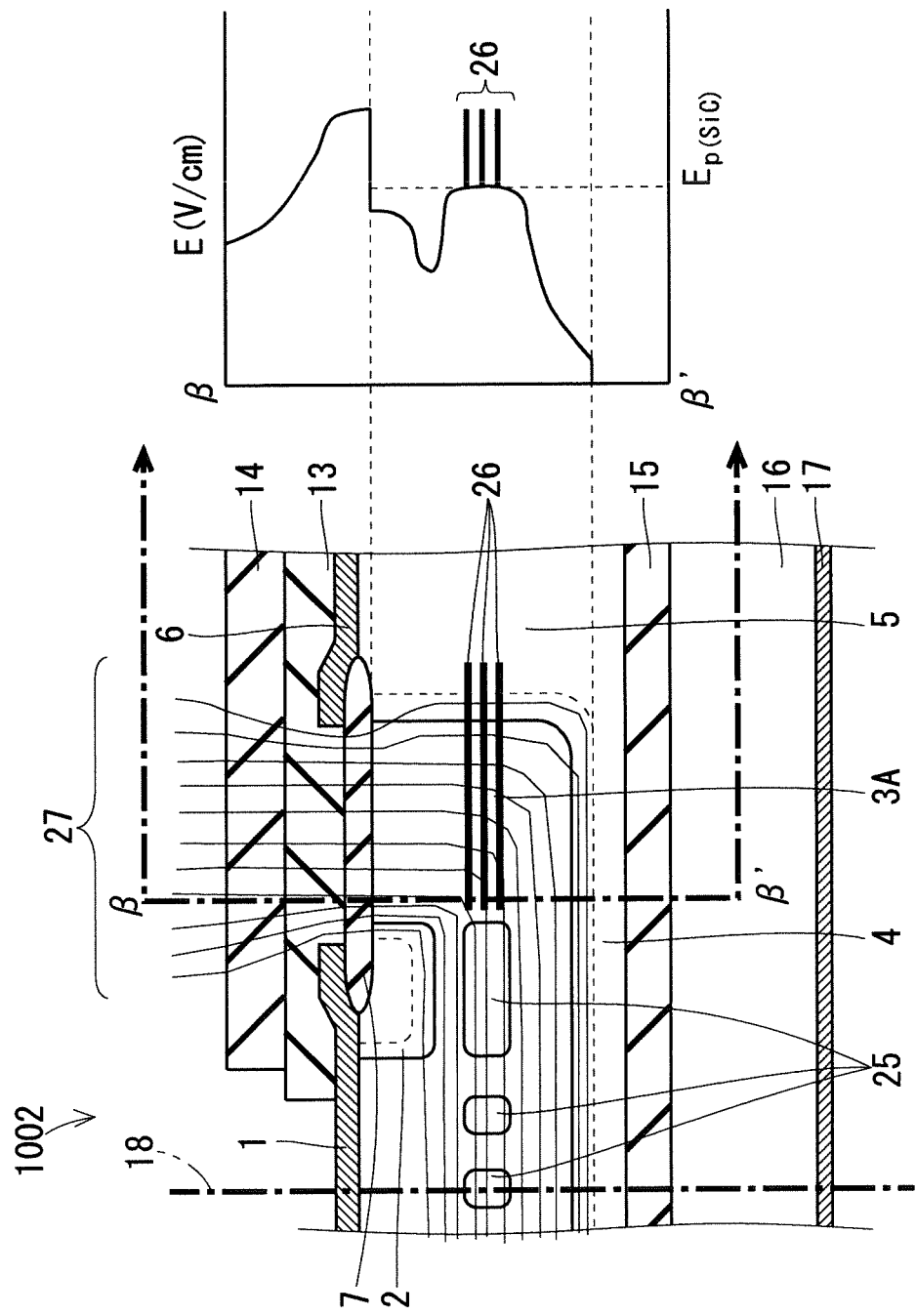
FIG. 13 is a cross-sectional view of the SiC-SOI device according to Embodiment 2 in a device region with application of a reverse bias voltage.

FIG. 13 illustrates an electric potential distribution and a field intensity distribution when the device region of the SiC-SOI device 1002 is reverse-biased. The left image in FIG. 13 illustrates an electric potential distribution 27 in a depletion layer of the p-n junction portion between the p-type diffusion region 2 and the n⁻ type drift region 3A. The right image in FIG. 13 illustrates one dimensional profile of the electric field intensity E taken along a section β-β' in the left image.

This image shows that the field intensity $E_{p(SiC)}$ in a formation region of the thin insulating films 26 is high in the n⁻ type drift region 3A. The effective breakdown voltage will be improved because the avalanche current multiplication is suppressed in the formation region of the thin insulating films 26 even when the field intensity $E_{p(SiC)}$ reaches the avalanche critical field intensity in the formation region of the thin insulating films 26 along with increase in the applied bias voltage.

C-3. Manufacturing Method

A method for manufacturing the SiC-SOI device 1002 conforms to the method for manufacturing the SiC-SOI device 1001 according to Embodiment 1. The method for manufacturing the SiC-SOI device 1002 differs from the method for manufacturing the SiC-SOI device 1001 by forming the thin insulating films 26 instead of the thin insulating films 23 in FIG. 6, and forming the p-type buried regions 25 deeper than the p-type diffusion region 2 and as deep as the thin insulating films 26 when the p-type diffusion region 2 illustrated in FIG. 9 is formed.

Specifically, the method for manufacturing the SiC-SOI device 1002 includes: (a) forming the p-type diffusion region 2 that is a third diffusion region of a second conductivity type, in a surface layer of a drift region 3A included in the SiC substrate 301 of a first conductivity type; (b) forming the p-type buried regions 25 deeper than the p-type diffusion region 2 in the drift region 3A, the buried regions being buried regions of the second conductivity type; (c) forming the thin insulating films 26 that are a plurality of second thin insulating films, parallel to a surface of the drift region 3A at regular spacings of 0.4 µm or less and as deep as the p-type buried regions 25 in the drift region 3A; (d) bonding a rear surface of the SiC substrate 301 of the first conductivity type to the Si substrate 305 through the SiO₂ layer 306 that is an insulating layer; (e) forming the first trench 8 to continuously or intermittently surround the drift region 3A in the SiC substrate 301, the first trench not penetrating the SiC substrate 301 and being formed from a surface of the SiC substrate 301; (f) forming the n⁺ type side surface diffusion region 5 that is a first diffusion region of the first conductivity type, on each side surface of the first trench 8, the n⁺ type side surface diffusion region 5 being higher in impurity concentration than the drift region 3A; (g) forming the second trench 10 to surround the first trench 8, the second trench 10 penetrating the SiC substrate 301; and (h) forming the isolated insulating film region 11 on each side surface of the second trench 10.

C-4. Advantages

The SiC-SOI device 1002 according to Embodiment 2 includes the dielectric isolated substrate 16 that is a first substrate, and the SiC substrate 301 bonded to the dielectric isolated substrate 16 through the buried insulating film 15, the device region RD and the surrounding region RC surrounding the device region RD are formed in the SiC substrate 301, and the device region RD includes: the n⁻ type drift region 3A that is a drift region of the first conductivity type; the first trench 8 that continuously or intermittently surrounds the n⁻ type drift region 3A and that does not penetrate the SiC substrate; the n⁺ type side surface diffusion region 5 that is formed on each side surface of the first trench 8 and that is a first diffusion region of the first conductivity type; the n⁺ type bottom diffusion region 4 that is formed under the n⁻ type drift region 3A, is in contact with the n⁺ type side surface diffusion region 5, and is a second diffusion region of the first conductivity type; the p-type diffusion region 2 that is a third diffusion region of a second conductivity type and formed in a surface layer of the n⁻ type drift region 3A; the p-type buried regions 25 that are buried regions of the second conductivity type and formed deeper than the p-type diffusion region 2 in the n⁻ type drift region 3A; and a plurality of the thin insulating films 26 that are a plurality of second thin insulating films and formed parallel to a surface of the n⁻ type drift region 3A at regular spacings of 0.4 µm or less and as deep as the p-type buried regions 25 in the n⁻ type drift region 3A. Even upon occurrence of the avalanche current in a formation region of the thin insulating films 26, an advantage of suppressing the avalanche current multiplication will be produced. Thus, adjustment of the device structure to locally maximize the field intensity in the formation region of the thin insulating films 26 can increase the breakdown voltage value without thickening the SOI layer.

D. Embodiment 3

D-1. Structure

Figure 14:
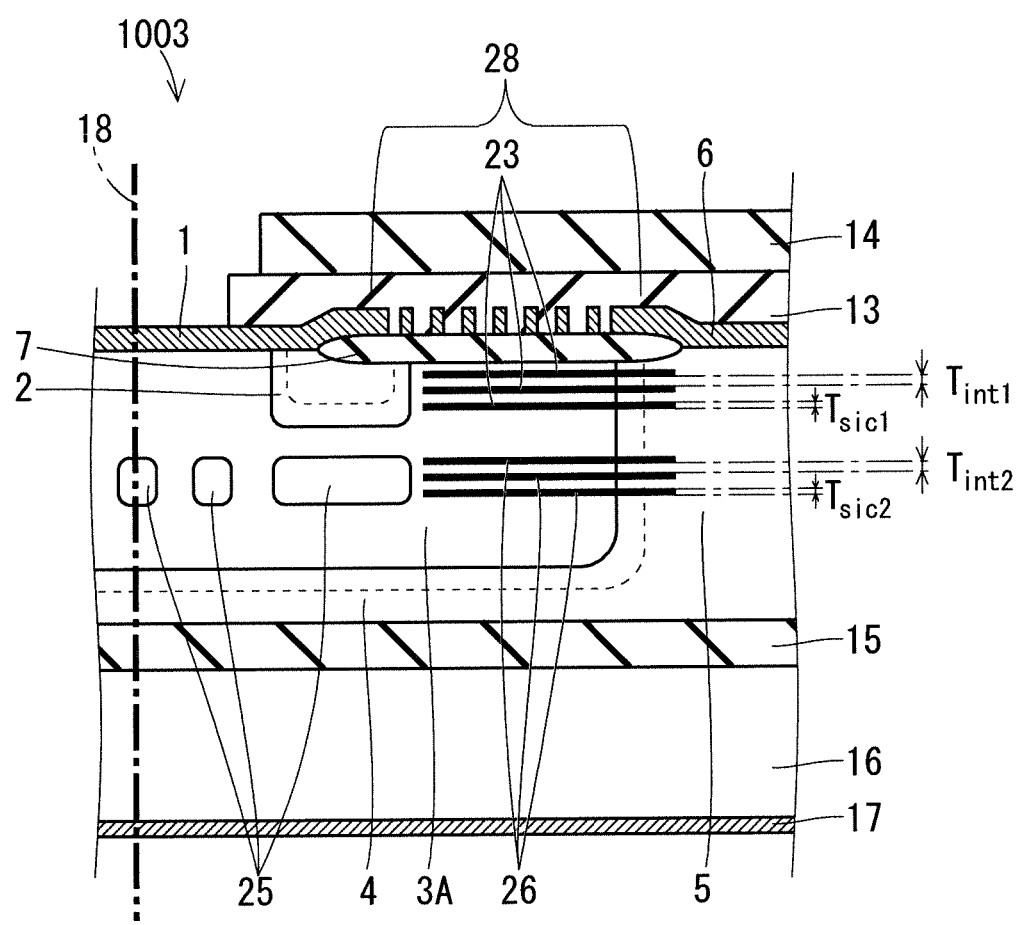
FIG. 14 is a cross-sectional view of a SiC-SOI device according to Embodiment 3.

FIG. 14 is a cross-sectional view of a device region of a SiC-SOI device 1003 according to Embodiment 3. The SiC-SOI device 1003 has capacitive-division structures 28 between the anode electrode 1 and the cathode electrode 6 on the field insulating film 7 on the surface side of the n⁻ type drift region 3A. The capacitive-division structures 28 correspond to a plurality of electrodes in a floating state, and equally distribute the electric potentials by dividing the capacitance between the anode electrode 1 and the cathode electrode 6.

A plurality of the thin insulating films 23 are formed parallel to and in proximity to the surface of the n⁻ type drift region 3A, similarly as the SiC-SOI device 1001 according to Embodiment 1. The thickness $T_{sic1}$ of the thin insulating films 23 is defined as a predetermined value, and the spacing $T_{int1}$ between the adjacent thin insulating films 23 is less than or equal to 0.4 µm. The structure of the SiC-SOI device 1003 except for the capacitive-division structures 28 and the thin insulating films 23 is the same as that of the SiC-SOI device 1002 according to Embodiment 2.

D-2. Operations

Figure 15:
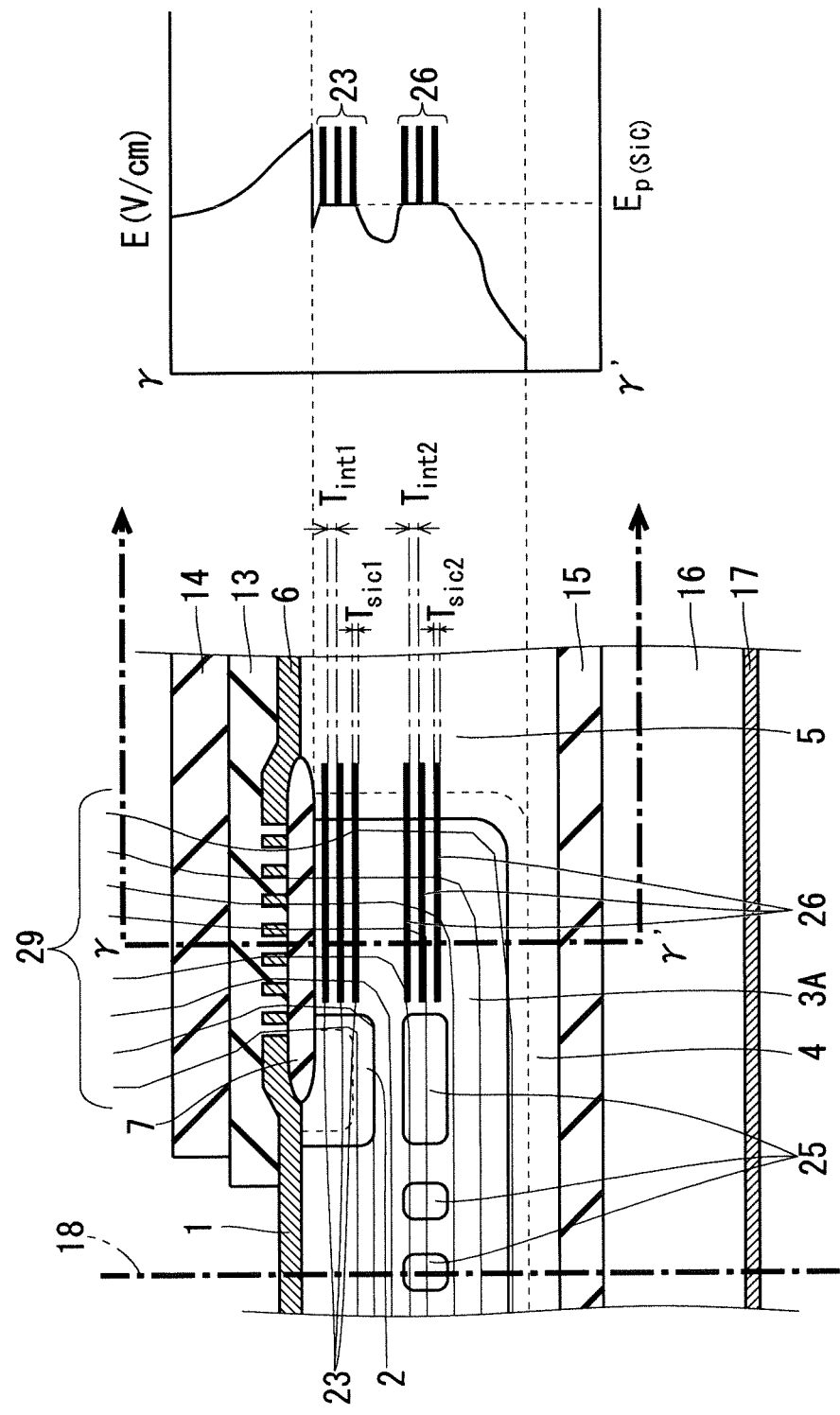
FIG. 15 is a cross-sectional view of the SiC-SOI device according to Embodiment 3 in a device region with application of a reverse bias voltage.

FIG. 15 illustrates an electric potential distribution and a field intensity distribution when the device region of the SiC-SOI device 1003 is reverse-biased. The left image in FIG. 15 illustrates an electric potential distribution 29 in a depletion layer of the p-n junction portion between the p-type diffusion region 2 and the n⁻ type drift region 3A. The right image in FIG. 15 illustrates one dimensional profile of the electric field intensity E taken along a section γ-γ' in the left image.

Since the capacitive-division structures 28 make the field intensity uniform in the field insulating film 7, the field intensity in the vicinity of an interface between the field insulating film 7 and the n⁻ type drift region 3A is also reduced. A relatively high field intensity distribution is recognized in formation regions of the thin insulating films 23 and 26 in the n⁻ type drift region 3A. However, even upon occurrence of the avalanche current in these formation regions, the avalanche current multiplication is suppressed because the spacing between the adjacent thin insulating films 23 and the spacing between the adjacent thin insulating films 26 are each less than or equal to 0.4 µm. Thus, the effective breakdown voltage will be improved.

D-3. Advantages

The device region RD in the SiC-SOI device 1003 according to Embodiment 3 includes: the anode electrode 1 that is a first electrode formed on the p-type diffusion region 2; the cathode electrode 6 that is a second electrode formed on the n⁺ type side surface diffusion region 5 that is the first diffusion region; the field insulating film 7 formed on the n⁻ type drift region 3A between the p-type diffusion region 2 and the n⁺ type side surface diffusion region 5; the capacitive-division structures 28 formed on the field insulating film 7; and the thin insulating films 23 that are a plurality of first thin insulating films formed parallel to and in proximity to the surface of the n⁻ type drift region 3A at regular spacings of 0.4 µm or less. Thus, the capacitive-division structures 28 grade the electric field in the interface between the field insulating film 7 and the n type drift region 3A. Moreover, adjustment of the device structure to locally maximize the field intensity in the formation region of the thin insulating films 23 and 26 can increase the breakdown voltage value without thickening the SOI layer.

Embodiments can be freely combined, and appropriately modified or omitted within the scope of the invention.

What is claimed is:

1. A SiC-SOI device, comprising:
a first substrate; and
a SiC substrate bonded to the first substrate through an insulating film,
wherein a device region, and a surrounding region surrounding the device region are formed in the SiC substrate,
the device region includes:
a drift region of a first conductivity type;

a first trench that continuously or intermittently surrounds the drift region and that does not penetrate the SiC substrate;
a first diffusion region of the first conductivity type that is formed on each side surface of the first trench, the first diffusion region being higher in impurity concentration than the drift region;
a second diffusion region of the first conductivity type that is formed under the drift region and is in contact with the first diffusion region, the second diffusion region being higher in impurity concentration than the drift region; and
a plurality of first thin insulating films formed parallel to and in proximity to a surface of the drift region at regular spacings of 0.4 μm or less, and
the surrounding region includes:
a second trench that is formed to continuously surround the first trench and that penetrates the SiC substrate; and
an isolated insulating film region formed on each side surface of the second trench.

2. A SiC-SOI device, comprising:
a first substrate; and
a SiC substrate bonded to the first substrate through an insulating film,
wherein a device region, and a surrounding region surrounding the device region are formed in the SiC substrate, and
the device region includes:
a drift region of a first conductivity type;
a first trench that continuously or intermittently surrounds the drift region and that does not penetrate the SiC substrate;
a first diffusion region of the first conductivity type that is formed on each side surface of the first trench, the first diffusion region being higher in impurity concentration than the drift region;
a second diffusion region of the first conductivity type that is formed under the drift region and is in contact with the first diffusion region, the second diffusion region being higher in impurity concentration than the drift region;
a third diffusion region of a second conductivity type that is formed in a surface layer of the drift region;
a buried region of the second conductivity type that is formed deeper than the third diffusion region in the drift region; and
a plurality of second thin insulating films formed parallel to a surface of the drift region at regular spacings of 0.4 μm or less and as deep as the buried region in the drift region.

3. The SiC-SOI device according to claim 2,
wherein the device region includes:
a first electrode formed on the third diffusion region;
a second electrode formed on the first diffusion region;
a field insulating film formed on the drift region between the first diffusion region and the third diffusion region;
a plurality of capacitive-division structures formed on the field insulating film; and
a plurality of first thin insulating films formed parallel to and in proximity to the surface of the drift region at regular spacings of 0.4 μm or less.

* * * * *